United States Patent
Jung et al.

(10) Patent No.: US 8,248,284 B2
(45) Date of Patent: Aug. 21, 2012

(54) ANALOG-TO-DIGITAL CONVERTERS, AND IMAGE SENSORS AND IMAGE PROCESSING DEVICES HAVING THE SAME

(75) Inventors: Wun-Ki Jung, Suwon-si (KR); Seog Heon Ham, Suwon-si (KR); Dong Hun Lee, Yongin-si (KR); Kwi Sung Yoo, Seoul (KR); Min Ho Kwon, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 139 days.

(21) Appl. No.: 12/801,062

(22) Filed: May 20, 2010

(65) Prior Publication Data

US 2011/0050473 A1    Mar. 3, 2011

(30) Foreign Application Priority Data

Aug. 26, 2009 (KR) .................. 10-2009-0079218

(51) Int. Cl.
*H03M 3/00* (2006.01)
(52) U.S. Cl. ....................... 341/143; 348/308
(58) Field of Classification Search .............. 341/143, 341/169, 155, 167, 168, 170; 348/308, 222, 348/241
See application file for complete search history.

(56) References Cited

U.S. PATENT DOCUMENTS

| | | | |
|---|---|---|---|
| 6,476,864 B1 | 11/2002 | Borg et al. | |
| 6,608,575 B2 | 8/2003 | Bazarjani | |
| 7,567,192 B2 * | 7/2009 | Colmer | 341/143 |
| 7,679,542 B2 * | 3/2010 | Ham et al. | 341/169 |
| 2008/0158378 A1 * | 7/2008 | Lee | 348/222.1 |
| 2009/0066826 A1 * | 3/2009 | Gelfand | 348/308 |

FOREIGN PATENT DOCUMENTS

| | | |
|---|---|---|
| JP | 2005-094093 | 4/2005 |
| KR | 10-1992-0022787 | 11/1992 |

* cited by examiner

*Primary Examiner* — Joseph Lauture
(74) *Attorney, Agent, or Firm* — Harness, Dickey & Pierce, P.L.C.

(57) ABSTRACT

An analog-digital converter (ADC) includes a correlated double sampling (CDS) circuit configured to perform CDS on each of a reset signal and an image signal output from a pixel to generate a correlated double sampled reset signal and a correlated double sampled image signal, respectively. A delta sigma ($\Delta\Sigma$) ADC, also included in the ADC, is configured to output a difference between a first digital code that is generated by performing $\Delta\Sigma$ analog-digital conversion on the correlated double sampled reset signal and a second digital code that is generated by performing $\Delta\Sigma$ analog-digital conversion on the correlated double sampled image signal.

12 Claims, 12 Drawing Sheets

FIG. 12

ANALOG-TO-DIGITAL CONVERTERS, AND IMAGE SENSORS AND IMAGE PROCESSING DEVICES HAVING THE SAME

CROSS-REFERENCE TO RELATED APPLICATIONS

This non-provisional application claims priority under 35 U.S.C. §119 to Korean Patent Application No. 10-2009-0079218, filed on Aug. 26, 2009, in the Korean Intellectual Property Office, the disclosure of which is incorporated herein in its entirety by reference.

BACKGROUND

Example embodiments relate to a semiconductor device, and more particularly, to an analog-digital converter (ADC) configured to remove an offset component of an amplifier, and an image processing device including the ADC.

General image sensors are roughly classified into charge coupled device (CCD) image sensors and CMOS image sensors (CISs). Compared with the CCD image sensors, the CISs are relatively economical because they can be manufactured using general CMOS technology, and are advantageous because they can be integrated with an analog/digital signal processing circuit with relative ease.

In addition, the CISs can be designed to operate with low power and low voltage, and are widely used in portable apparatuses such as mobile phones, smart phones, or digital cameras requiring low power consumption. A pixel array of a CIS includes a plurality of pixels arranged in a two-dimensional matrix. Each of the pixels may generate an image signal from an optical signal. In detail, each of the pixels integrates photocharges corresponding to the amount of light incident using a photodiode and generates an analog pixel signal corresponding to the integrated photocharges.

In general, the analog pixel signal output from each of the pixels is converted into a digital signal by an ADC, and the digital signal is image-processed by an image signal processor (ISP). A conventional delta-sigma (ΔΣ) ADC that can be used during analog-digital conversion may convert an analog pixel signal into a digital bitstream by delta-sigma modulation, and obtain the digital signal corresponding to the analog pixel signal from the digital bitstream.

SUMMARY

Example embodiments are directed to an analog-digital converter (ADC) configured to remove an offset voltage generated during correlated double sampling (CDS) from an amplifier, and an image sensor and an image processing device that include the ADC.

According to an example embodiment, an ADC includes a CDS circuit configured to perform CDS on each of a reset signal and an image signal output from a pixel to generate a correlated double sampled reset signal and a correlated double sampled image signal, respectively; and a delta sigma (ΔΣ) ADC configured to output a difference between a first digital code generated by performing ΔΣ analog-digital conversion on the correlated double sampled reset signal and a second digital code generated by performing ΔΣ analog-digital conversion on the correlated double sampled image signal.

According to an example embodiment, the ΔΣ ADC is configured to generate the first digital code such that the first digital code sequentially increases from an initial value during a reset phase, to generate the second digital code such that the second digital code sequentially increases from the initial value during a signal phase, and to output a difference between the first digital code and the second digital code.

According to an example embodiment, the ΔΣ ADC is configured to generate the first digital code such that the first digital code sequentially decreases from an initial value during a reset phase, and to output, as a difference between the first and second digital codes, a digital code such that the digital code sequentially increases from the first digital code during a signal phase.

According to an example embodiment, the ΔΣ ADC is configured to generate the first digital code such that the first digital code sequentially increases from an initial value during a reset phase, to bitwise invert the first digital code in response to a control signal, and to output, as a difference between the first and second digital codes, a digital code such that the digital code sequentially increases from the bitwise-inverted digital code and corresponds to a result of the bitwise inversion during a signal phase.

According to an example embodiment, the CDS circuit includes an amplifier, the first digital code includes an offset component of the amplifier, and the second digital code includes the offset component of the amplifier and a signal component corresponding to a difference between the correlated double sampled reset signal and the correlated double sampled image signal.

According to an example embodiment, an image sensor includes a pixel configured to output a reset signal and an image signal; a CDS circuit configured to perform CDS on each of the reset signal and the image signal to generate a correlated double sampled reset signal and a correlated double sampled image signal, respectively; and a ΔΣ ADC configured to output a difference between a first digital code generated by performing ΔΣ analog-digital conversion on the correlated double sampled reset signal and a second digital code generated by performing ΔΣ analog-digital conversion on the correlated double sampled image signal.

The first digital code includes information regarding an offset component of an amplifier included in the CDS circuit, and the second digital code includes the offset voltage and information about a difference between the correlated double sampled reset signal and the correlated double sampled image signal.

According to an example embodiment, an image processing device includes an image sensor; and a processor configured to control an operation of the image sensor.

The image sensor includes a pixel configured to output a reset signal and an image signal; a CDS circuit configured to perform CDS on each of the reset signal and the image signal to generate a correlated double sampled reset signal and a correlated double sampled image signal, respectively; and a ΔΣ ADC configured to output a difference between a first digital code generated by performing ΔΣ analog-digital conversion on the correlated double sampled reset signal and a second digital code generated by performing ΔΣ analog-digital conversion on the correlated double sampled image signal.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
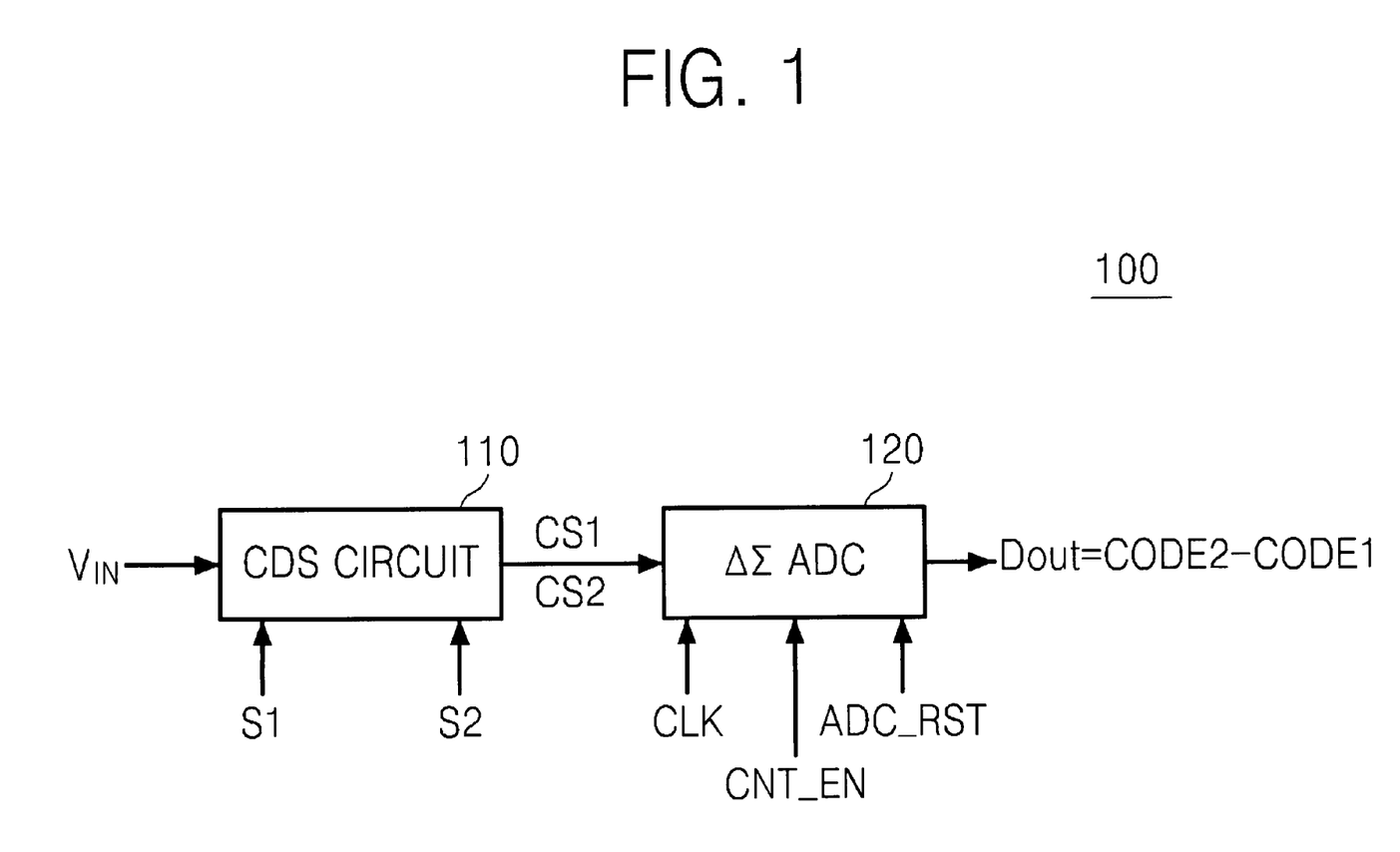
FIG. 1 is a block diagram of an analog-digital converter (ADC) according to an example embodiment.

FIG. 1 is a block diagram of an analog-digital converter (ADC) 100 according to an example embodiment. Referring to FIG. 1, the ADC 100 includes a correlated double sampling (CDS) circuit 110 and a delta-sigma (ΔΣ) ADC 120.

The CDS circuit 110 sequentially receives pixel signals $V_{IN}$, for example, a reset signal and an image signal, from a signal source, for example, an active pixel array (not shown), and performs CDS on each of the pixel signals to sequentially output a correlated double sampled reset signal CS1 and a correlated double sampled image signal CS2.

The ΔΣ ADC 120 performs ΔΣ modulation on each of the correlated double sampled reset signal CS1 and the correlated double sampled image signal CS2 sequentially output from the CDS circuit 110, in response to control signals (for example, a clock signal CLK and an ADC enable signal CNT_EN), thereby outputting a signal Dout, a digital code corresponding to a difference between a first digital code CODE1 and a second digital code CODE2.

Figure 2:
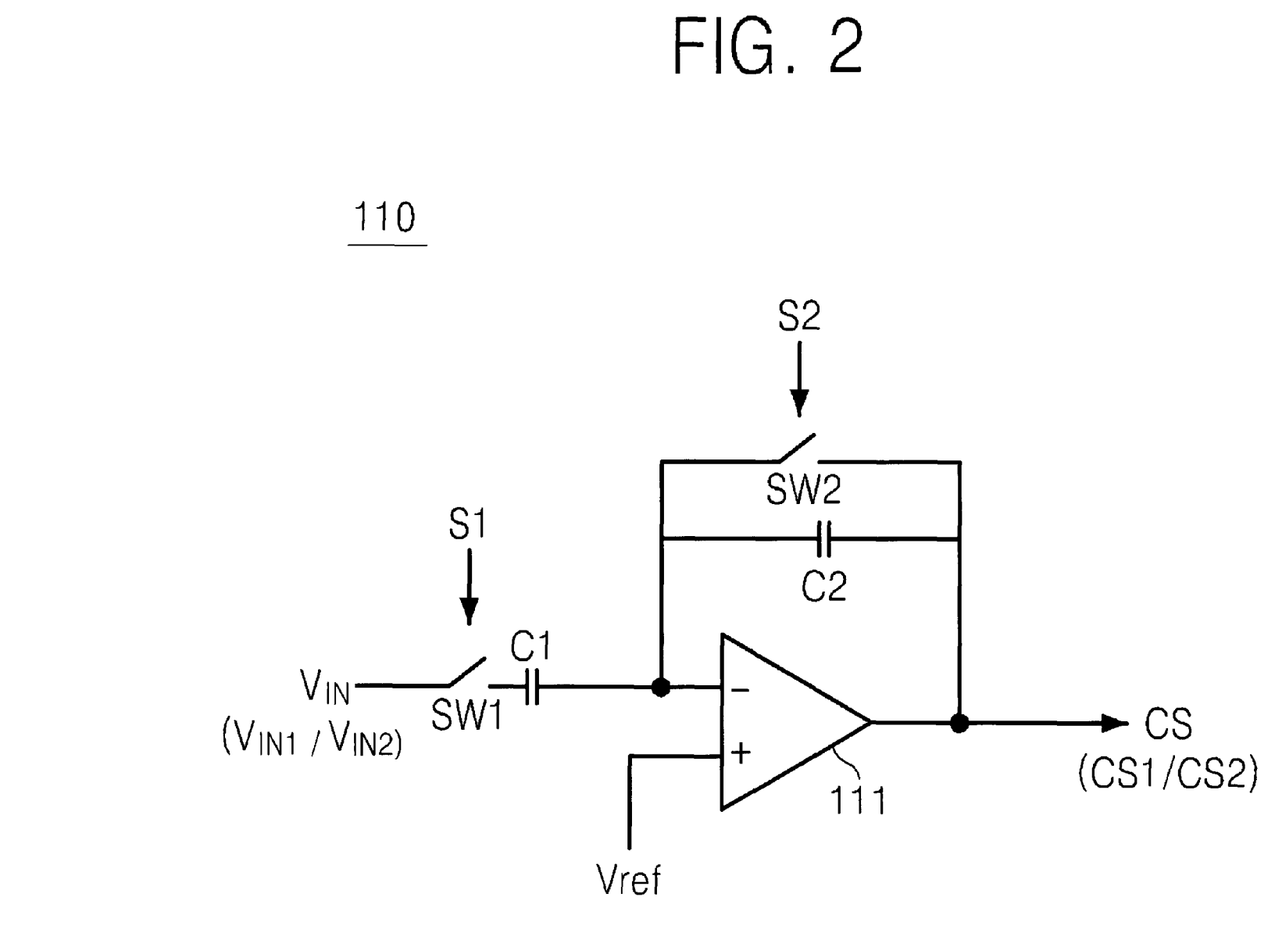
FIG. 2 is a circuit diagram of a correlated double sampling (CDS) circuit included in the ADC illustrated in FIG. 1.

FIG. 2 is a circuit diagram of the CDS circuit 110 illustrated in FIG. 1. Referring to FIG. 2, the CDS circuit 110 includes an amplifier 111, a first capacitor C1, a second capacitor C2, and a plurality of switches, namely, a first switch SW1 and a second switch SW2.

The amplifier 111 may be an operational amplifier, for example. Accordingly, the amplifier 111 may generate an offset voltage because of its structure and/or components used therein. The first switch SW1 controls a pixel signal, for example, a reset signal $V_{IN1}$ and/or an image signal $V_{IN2}$, that is transmitted to the first capacitor C1, in response to a first switching signal S1. The first capacitor C1 may be connected between the first switch SW1 and a first input terminal, for example, a (−) input terminal, of the amplifier 111 and may sample the reset signal $V_{IN1}$ and/or the image signal $V_{IN2}$.

The second switch SW2 connects/disconnects the first input terminal of the amplifier 111 to/from an output terminal of the amplifier 111 in response to a second switching signal S2. The second capacitor C2 is connected to the second switch SW2 in parallel. A reference voltage Vref is input to a second input terminal, for example, a (+) input terminal, of the amplifier 111.

Figure 3:
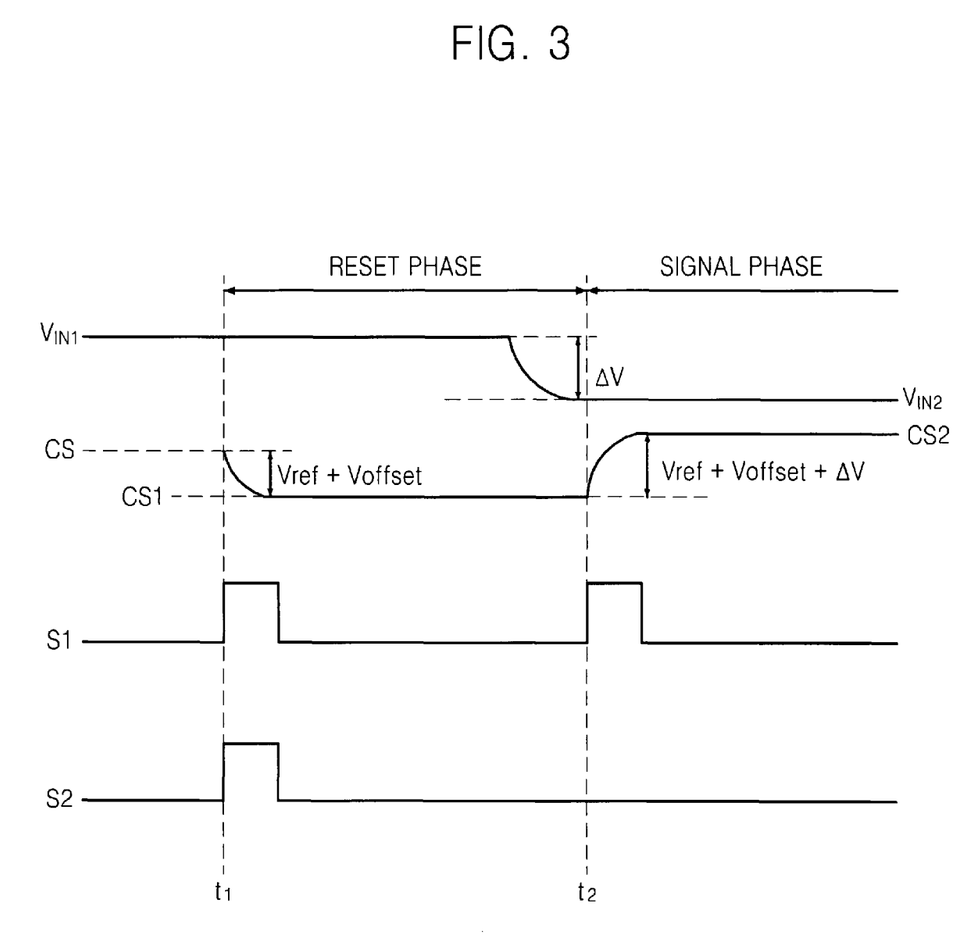
FIG. 3 is a liming diagram of the CDS circuit illustrated in FIG. 2.

FIG. 3 is a timing diagram of the CDS circuit 110 illustrated in FIG. 2. Referring to FIGS. 2 and 3, a voltage difference ΔV is generated between the reset signal $V_{IN1}$ and the image signal $V_{IN2}$ sequentially input to the CDS circuit 110.

At a first point of time t1 of a reset phase RESET PHASE, when the first and second switches SW1 and SW2 are turned on in response to the first and second switching signals S1 and S2, respectively, the reset signal $V_{IN1}$ is sampled (or charged) in the first capacitor C1, and the second capacitor C2 is discharged. Thereafter, when the first and second switches SW1 and SW2 are turned off in response to the first and second switching signal S1 and S2, respectively, the CDS circuit 110 outputs, as the correlated double sampled reset signal CS1, a first voltage (Vref+Voffset) corresponding to a sum of the reference voltage Vref input to the second input terminal of the amplifier 111 and a noise voltage, for example, the offset voltage Voffset, generated by the amplifier 111.

At a second point of time t2 of a signal phase SIGNAL PHASE, when the image signal $V_{IN2}$ is transmitted to the first capacitor C1 via the first switch SW1, the first capacitor C1 is charged with a voltage corresponding to the difference $\Delta V$ between the reset signal $V_{IN1}$ and the image signal $V_{IN2}$. Thereafter, when the first switch SW1 is turned off, the CDS circuit 110 outputs, as the correlated double sampled image signal CS2, a second voltage (Vref+Voffset+$\Delta V$) corresponding to a sum of the first voltage (Vref+Voffset) and the difference $\Delta V$. Accordingly, the ADC 100 may remove an offset from the amplifier 111 by using a difference between the second voltage (Vref+Voffset+$\Delta V$) and the first voltage (Vref+Voffset).

Figure 4:
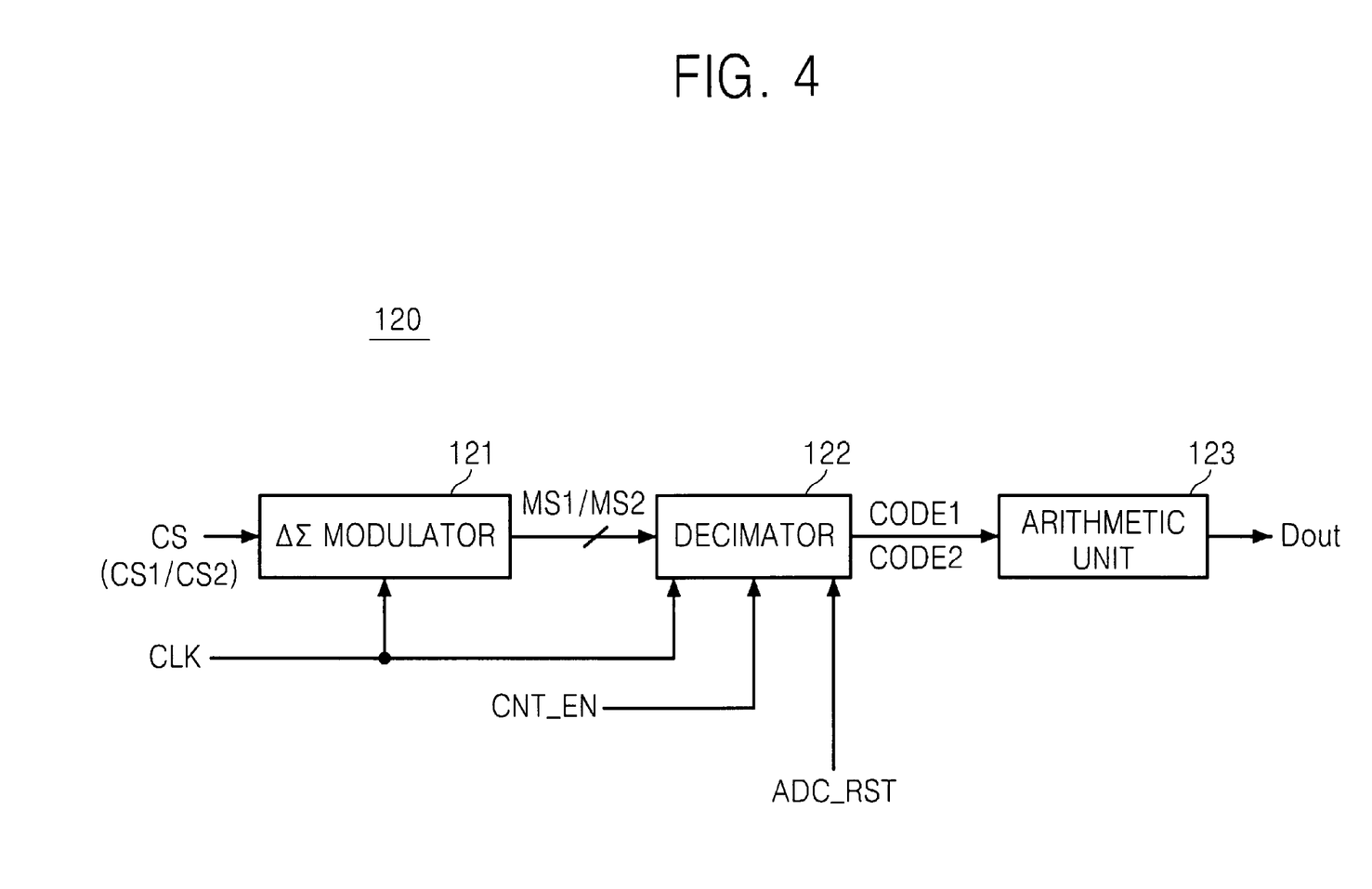
FIG. 4 is a block diagram of a delta-sigma (ΔΣ) ADC included in the ADC illustrated in FIG. 1, according to an example embodiment.

FIG. 4 is a block diagram of the $\Delta\Sigma$ ADC 120 illustrated in FIG. 1, according to an example embodiment. Referring to FIG. 4, the $\Delta\Sigma$ ADC 120 includes a $\Delta\Sigma$ modulator 121, an accumulator 122 configured to function as a decimator, and/or an arithmetic unit 123.

The $\Delta\Sigma$ modulator 121 performs $\Delta\Sigma$ modulation on each of the correlated double sampled reset signal CS1 and the correlated double sampled image signal CS2 sequentially output from the CDS circuit 110 to output a first modulated signal MS1 and a second modulated signal MS2.

For example, the $\Delta\Sigma$ modulator 121 performs $\Delta\Sigma$ modulation on each of the correlated double sampled reset signal CS1 and the correlated double sampled image signal CS2 output from the CDS circuit 110 in response to the clock signal CLK so as to output the first and second modulated signals MS1 and MS2 corresponding to results of the $\Delta\Sigma$ modulation. Each of the first and second modulated signals MS1 and MS2 may be an M-bit digital signal. Here, M denotes a real number.

The accumulator 122 may integrate signals output from the $\Delta\Sigma$ modulator 121, for example, the first and second modulated signals MS1 and MS2, in response to the clock signal CLK and the ADC enable signal CNT_EN so as to output the first digital code CODE1 and the second digital code CODE2, respectively. The accumulator 122 may be reset in response to a reset signal ADC_RST.

The arithmetic unit 123 may output as the output signal Dout the digital code corresponding to the difference between the first and second digital codes CODE1 and CODE2. In example embodiments, the arithmetic unit 123 may be implemented as a part of the accumulator 122.

Figure 5:
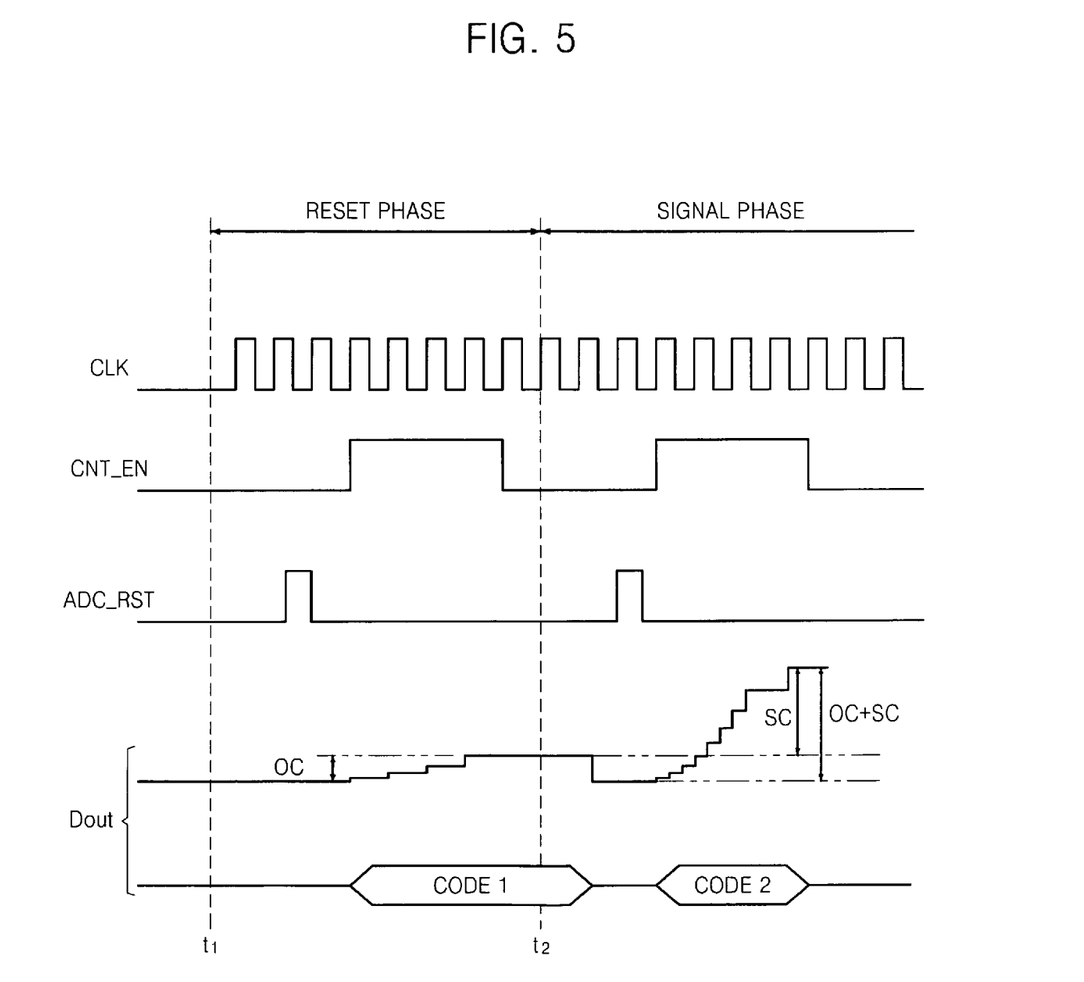
FIG. 5 is a timing diagram of the ΔΣ ADC illustrated in FIG. 4.

FIG. 5 is a timing diagram of the $\Delta\Sigma$ ADC 120 illustrated in FIG. 4. Referring to FIGS. 1 through 5, the correlated double sampled reset signal CS1 and the correlated double sampled image signal CS2 are converted into the first digital code CODE 1 and the second digital code CODE2, respectively, by the $\Delta\Sigma$ ADC 120.

During the reset phase RESET PHASE, the correlated double sampled reset signal CS1 is converted into the first digital code CODE 1 by the $\Delta\Sigma$ ADC 120, and the first digital code CODE1 is latched in the arithmetic unit 123.

For example, the accumulator 122 of the $\Delta\Sigma$ ADC 120 outputs the first digital code CODE1 in response to a first modulated signal MS1 and a clock signal CLK that are input while the ADC enable signal CNT_EN is active. In other words, the accumulator 122, functioning as a decimator, outputs the first digital code CODE1 corresponding to an offset component (OC), namely, the offset voltage Voffset, of the amplifier 111 on the basis of a clock signal CLK and a first modulated signal MS1 that are input in an interval D1 during which the ADC enable signal CNT_EN is active. Accordingly, the first digital code CODE 1 may depend on the offset voltage Voffset of the amplifier 111.

During the signal phase SIGNAL PHASE, the $\Delta\Sigma$ ADC 120 is reset to an initial value "0" in response to an activated reset signal ADC_RST. During the signal phase SIGNAL PHASE, the correlated double sampled image signal CS2 is converted into the second digital code CODE2 by the $\Delta\Sigma$ ADC 120. For example, the accumulator 122 of the $\Delta\Sigma$ ADC 120 outputs the second digital code CODE2 corresponding to a sum of the offset component OC and a signal component SC in response to a second modulated signal MS2 and a clock signal CLK that are input in an interval D2 during which the ADC enable signal $CNT_{13}$ EN is active.

The arithmetic unit 123 of the $\Delta\Sigma$ ADC 120 outputs as the output signal Dout the digital code corresponding to the difference between the first and second digital codes CODE1 and CODE2. Accordingly, the $\Delta\Sigma$ ADC 120 outputs as the output signal Dout a digital code corresponding to the signal component SC from which the offset voltage Voffset of the amplifier 111 has been removed. Here, the signal component SC denotes a difference between an image signal and a reset signal. The arithmetic unit 123 of the $\Delta\Sigma$ ADC 120 may subtract the first digital code CODE1 from the second digital code CODE2 to output the output signal Dout.

Figure 6:
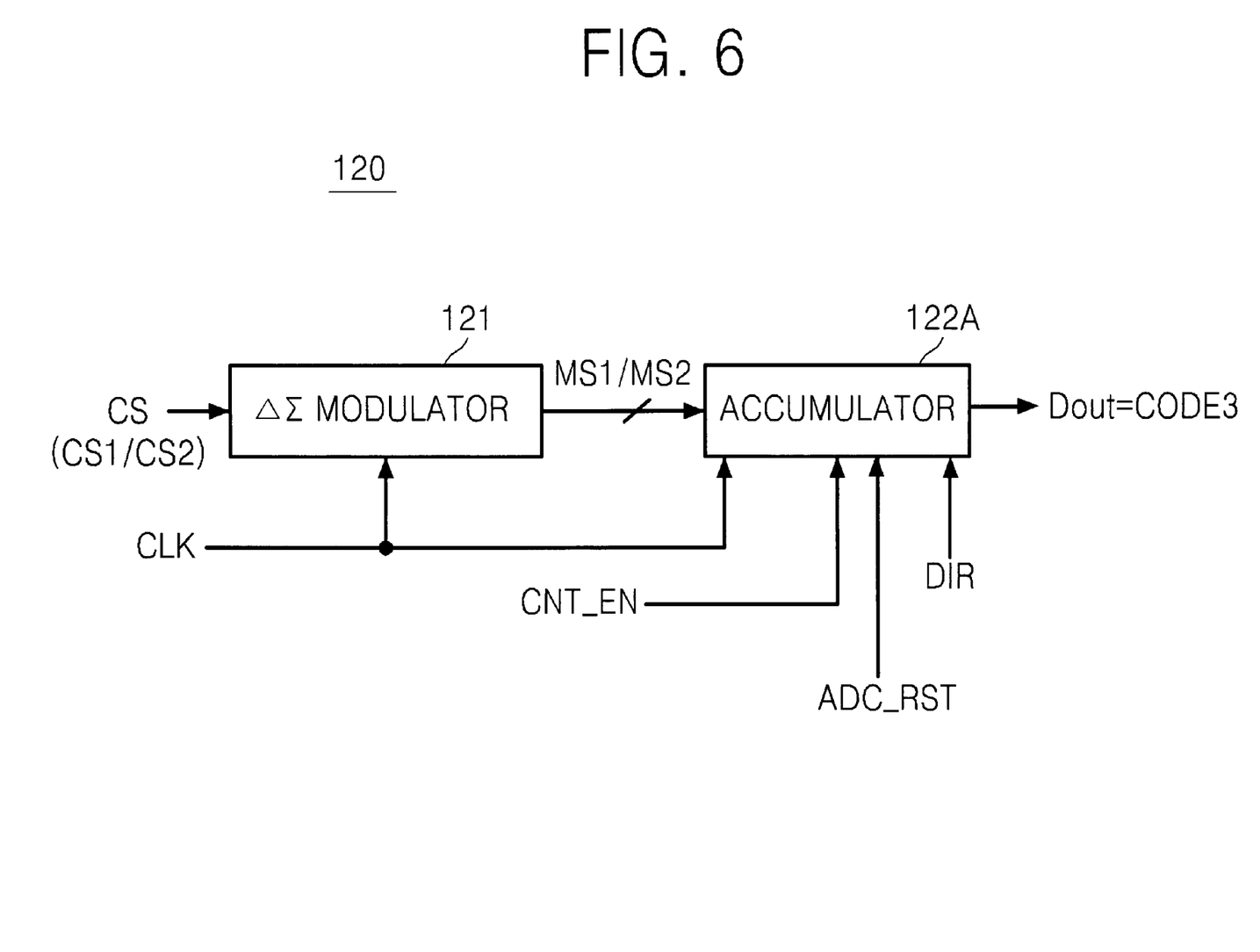
FIG. 6 is a block diagram of a ΔΣ ADC included in the ADC illustrated in FIG. 1, according to another example embodiment.

FIG. 6 is a block diagram of a $\Delta\Sigma$ ADC 620, according to another example embodiment. Referring to FIGS. 4 and 6, the $\Delta\Sigma$ ADC 620 may not include the arithmetic unit 123. An accumulator 122A of the $\Delta\Sigma$ ADC 620 may perform integration in a negative direction or a positive direction according to a direction indicating signal DIR.

Figure 7:
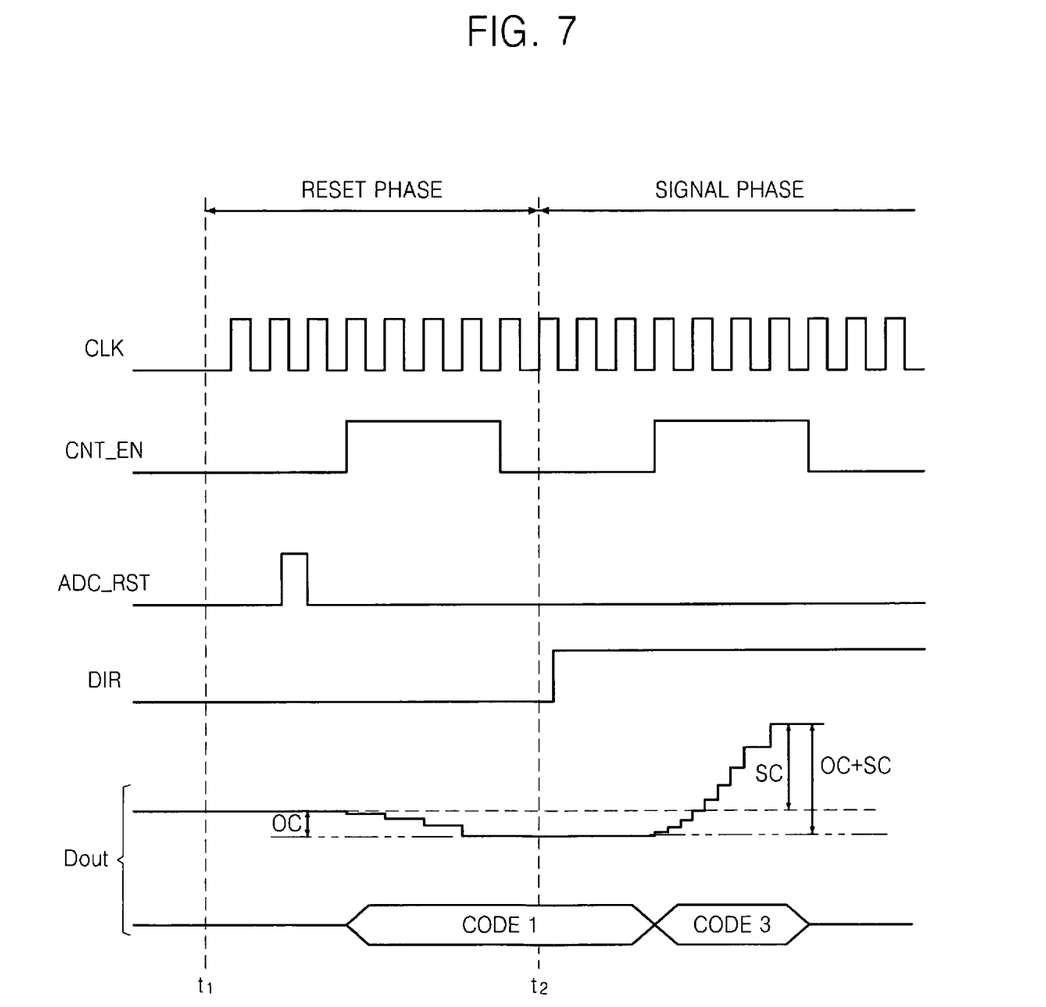
FIG. 7 is a timing diagram of the ΔΣ ADC illustrated in FIG. 6.

FIG. 7 is a timing diagram of the $\Delta\Sigma$ ADC 620 illustrated in FIG. 6. Referring to FIGS. 1, 2, 3, 4, 6, and 7, the correlated double sampled reset signal CS1 and the correlated double sampled image signal CS2 sequentially output from the CDS circuit 110 are converted into the first digital code CODE 1 and the second digital code CODE2, respectively, by the $\Delta\Sigma$ ADC 620.

During the reset phase RESET PHASE, the correlated double sampled reset signal CS1 is converted into the first digital code CODE1 by the $\Delta\Sigma$ ADC 620. For example, when the clock signal CLK is input and the direction indicating signal DIR has a low level, the accumulator 122 of the $\Delta\Sigma$ ADC 620 generates the first digital code CODE1 that is integrated in the (−) direction (or decremental), in response to the first modulated signal MS 1 and the clock signal CLK. In other words, when the clock signal CLK is input and the direction indicating signal DIR has a low level, the accumulator 122A of the $\Delta$ ADC 620 outputs the first digital code CODE1 corresponding to the offset component OC, namely, the offset voltage Voffset, of the amplifier 111.

During the signal phase SIGNAL PHASE, when the clock signal CLK is input and the direction indicating signal DIR has a high level, the accumulator 122A of the $\Delta\Sigma$ ADC 620 generates a third digital code CODE3 that is integrated in the (+) direction (or incremental), in response to the second modulated signal MS2 and the clock signal CLK. Consequently, the third digital code CODE3 corresponds to a difference between the first digital code CODE1, in which the offset component OC is reflected, and a digital code in which a sum of the offset component OC and the signal component SC is reflected.

Figure 8:
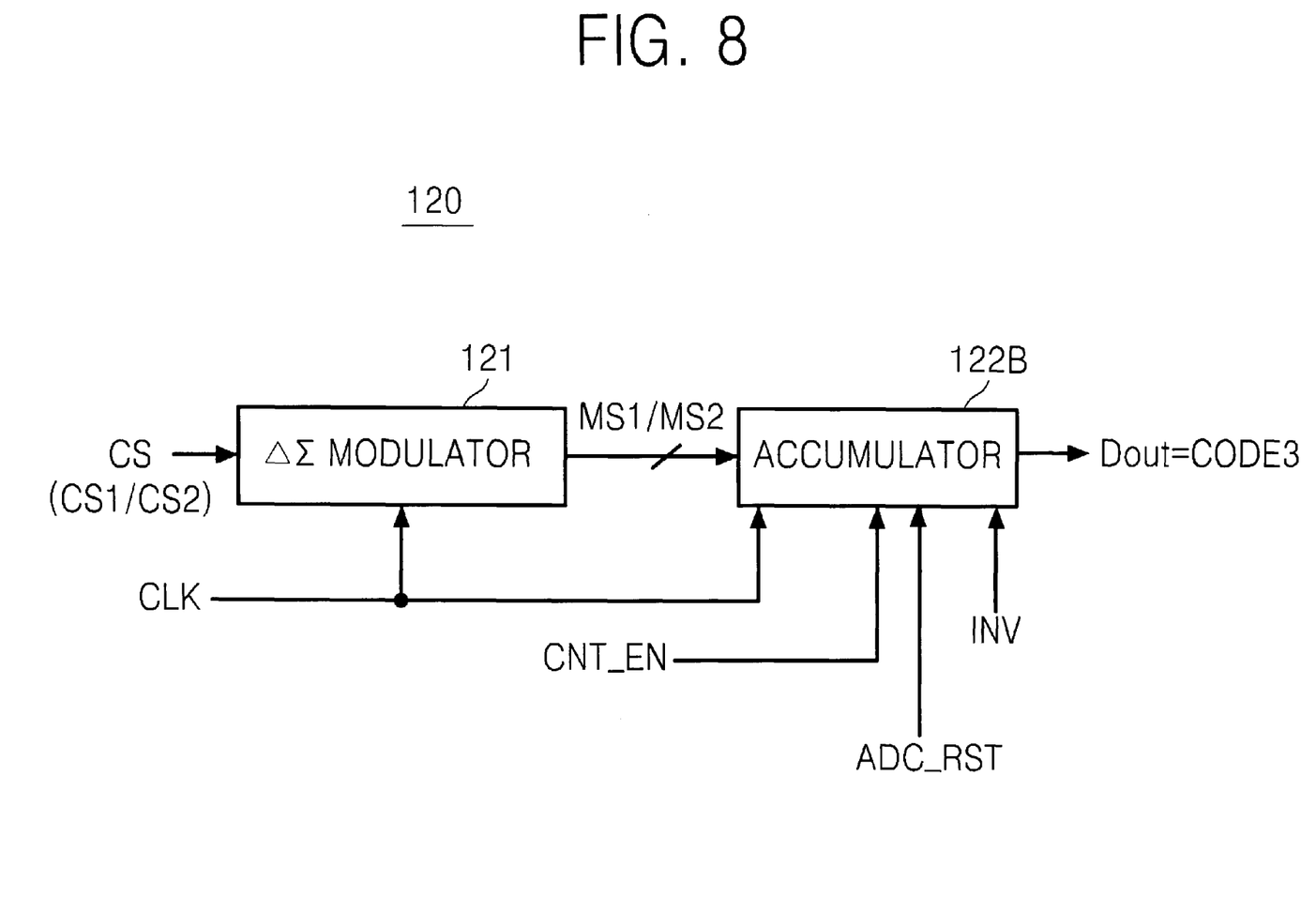
FIG. 8 is a block diagram of a ΔΣ ADC included in the ADC illustrated in FIG. 1, according to still another example embodiment.

FIG. 8 is a block diagram of the $\Delta\Sigma$ ADC 820, according to an example embodiment. An accumulator 122B illustrated in FIG. 8 bit-wise inverts the first digital code CODE1 in response to a bit inversion signal INV and generates the third digital code CODE3 that is integrated in the (+) direction (or increment) from an inverted digital code /CODE1 corresponding to a result of the bit-wise inversion.

Figure 9:
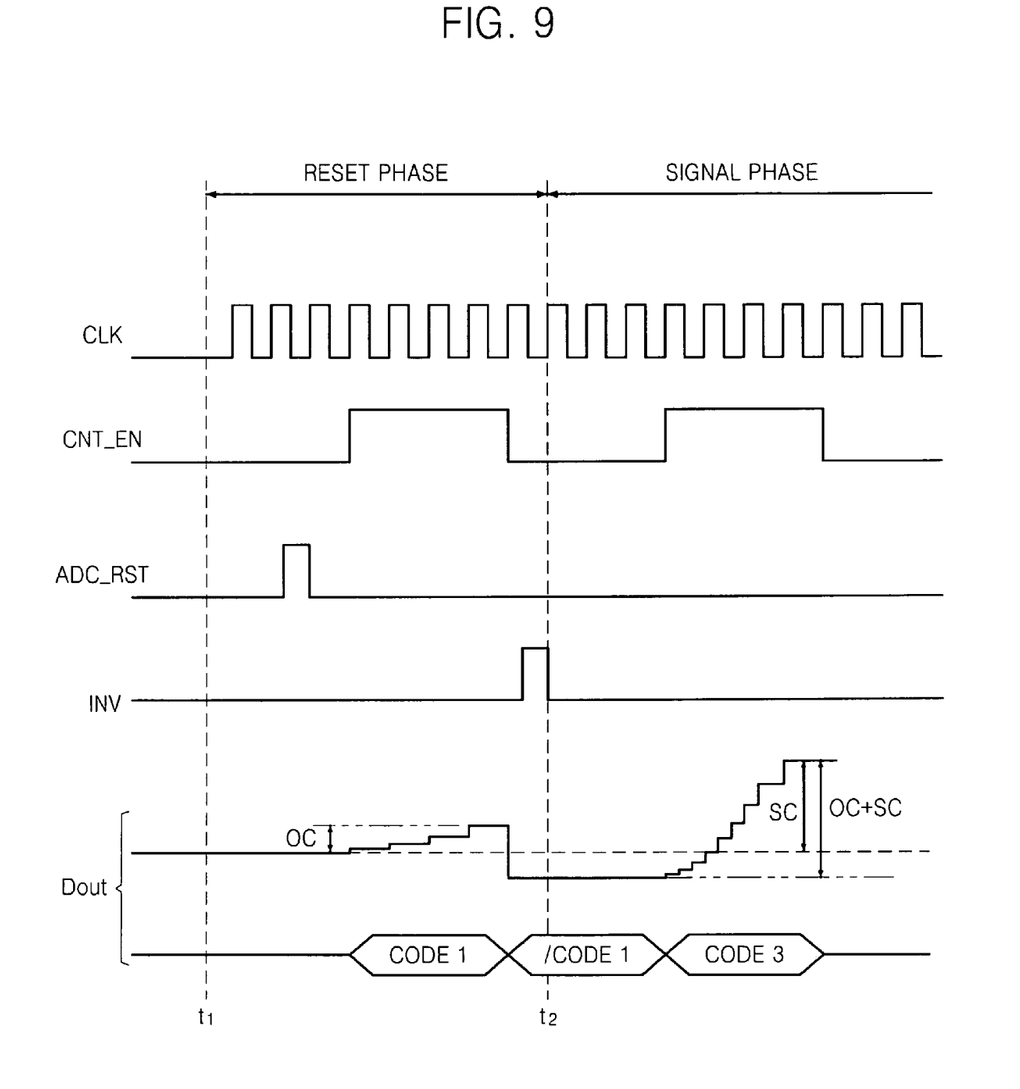
FIG. 9 is a timing diagram of the ΔΣ ADC illustrated in FIG. 8.

FIG. 9 is a timing diagram of the ΔΣ ADC 820. Referring to FIGS. 8 and 9, during the reset phase RESET PHASE, the correlated double sampled reset signal CS1 is converted into the first digital code CODE1 by the ΔΣ ADC 820. For example, while the clock signal CLK is being input, the accumulator 122B of the ΔΣ ADC 820 generates the first digital code CODE1 that is integrated in the (+) direction (or incremental step), in response to the first modulated signal MS1 and the clock signal CLK. In other words, the accumulator 122B of the ΔΣ ADC 820 outputs the first digital code CODE1 corresponding to the offset component OC, namely, the offset voltage Voffset of the amplifier 111.

In the reset phase RESET PHASE, the accumulator 122B of the ΔΣ ADC 820 bit-wise inverts the first digital code CODE1 in response to the bit inversion signal INV and outputs the inverted digital code /CODE1 corresponding to a result of the bit-wise inversion.

In the signal phase SIGNAL PHASE, while the clock signal CLK is being input, the accumulator 122B of the ΔΣ ADC 820 generates the third digital code CODE3 that is integrated in the (+) direction (or the third digital code CODE3) from the inverted digital code /CODE1, in response to the second modulated signal MS2 and the clock signal CLK. Consequently, the third digital code CODE3 corresponds to the difference between the first digital code CODE1, in which the offset component OC is reflected, and the digital code in which the sum of the offset component OC and the signal component SC is reflected.

In other words, the ADC 100 including the ΔΣ ADC 820 bit-wise inverts a result of a first analog-digital conversion and then performs a second analog-digital conversion. Accordingly, the ΔΣ ADC 820 of FIG. 8 outputs a result of two analog-digital conversion operations, that is, a result including only the signal component SC.

Figure 10:
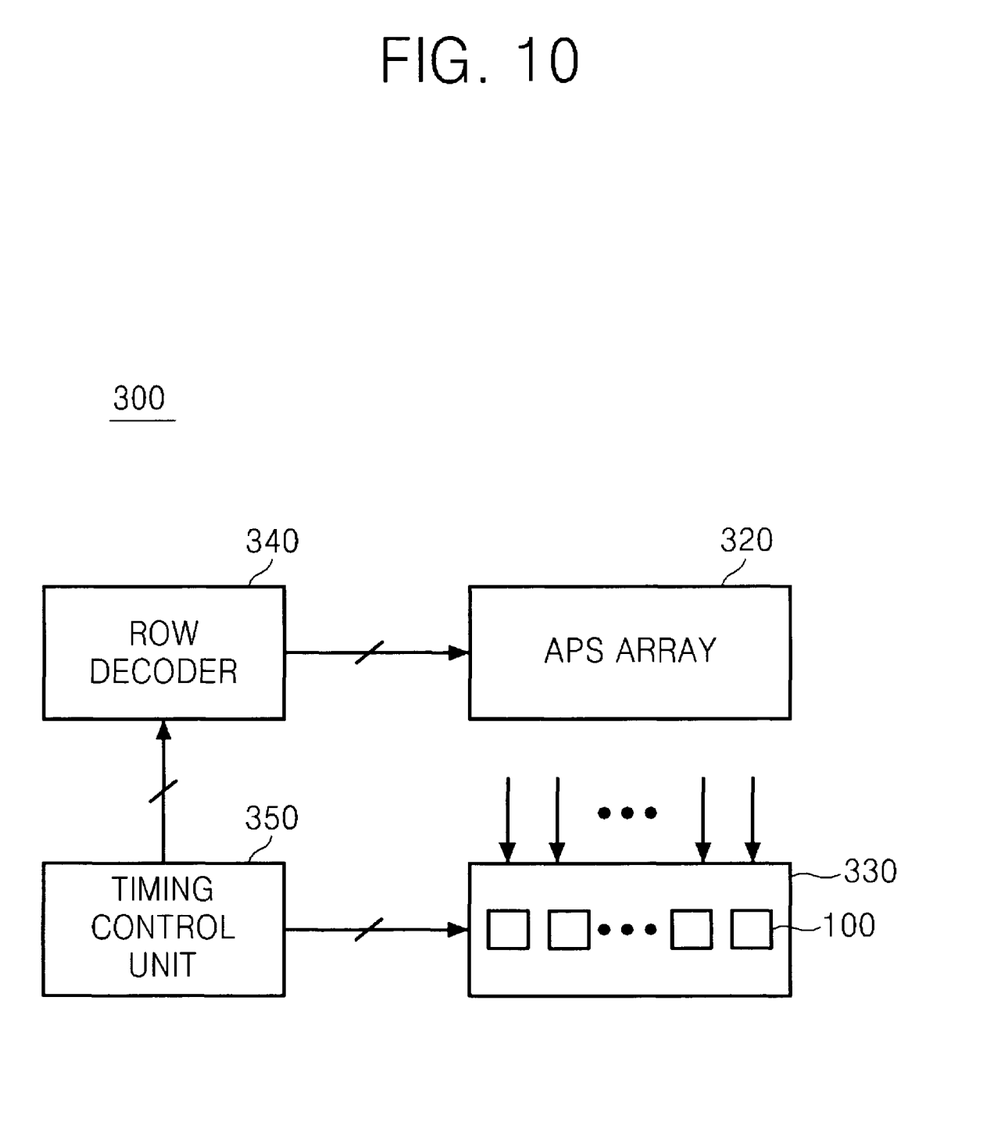
FIG. 10 is a schematic block diagram of an image sensor including the ADC of FIG. 1, according to an example embodiment.

FIG. 10 is a schematic block diagram of an image sensor 300 including the ADC 100 of FIG. 1, according to an example embodiment. Referring to FIG. 10, the image sensor 300 may include an active pixel sensor (APS) array 320, a row decoder 340, a timing control unit 350, and/or an ADC block 330.

The APS array 320 may include a plurality of pixels (not shown), a plurality of rows (not shown), and a plurality of columns (not shown). The pixels are connected to intersections between the rows and the columns.

The row decoder 340 selects at least one of the rows in response to a plurality of control signals output from the timing control unit 350. A column decoder (not shown) selects at least one of the columns in response to the control signals output from the timing control unit 350.

The timing control unit 350 may generate at least one of the first and second switching signals S1 and S2, the ADC enable signal CNT_EN, the reset signal ADC_RST, the direction indicating signal DIR, and/or the bit inversion signal INV.

The ADC block 330 may include a plurality of ADCs 100 of FIG. 1 connected to the columns, respectively. Each of the ADCs 100 may receive pixel signals, for example, a reset signal and an image signal, output from corresponding columns from among the plurality of column lines, and perform CDS and analog-digital conversion (ADC) on the received pixel signals.

Figure 11:
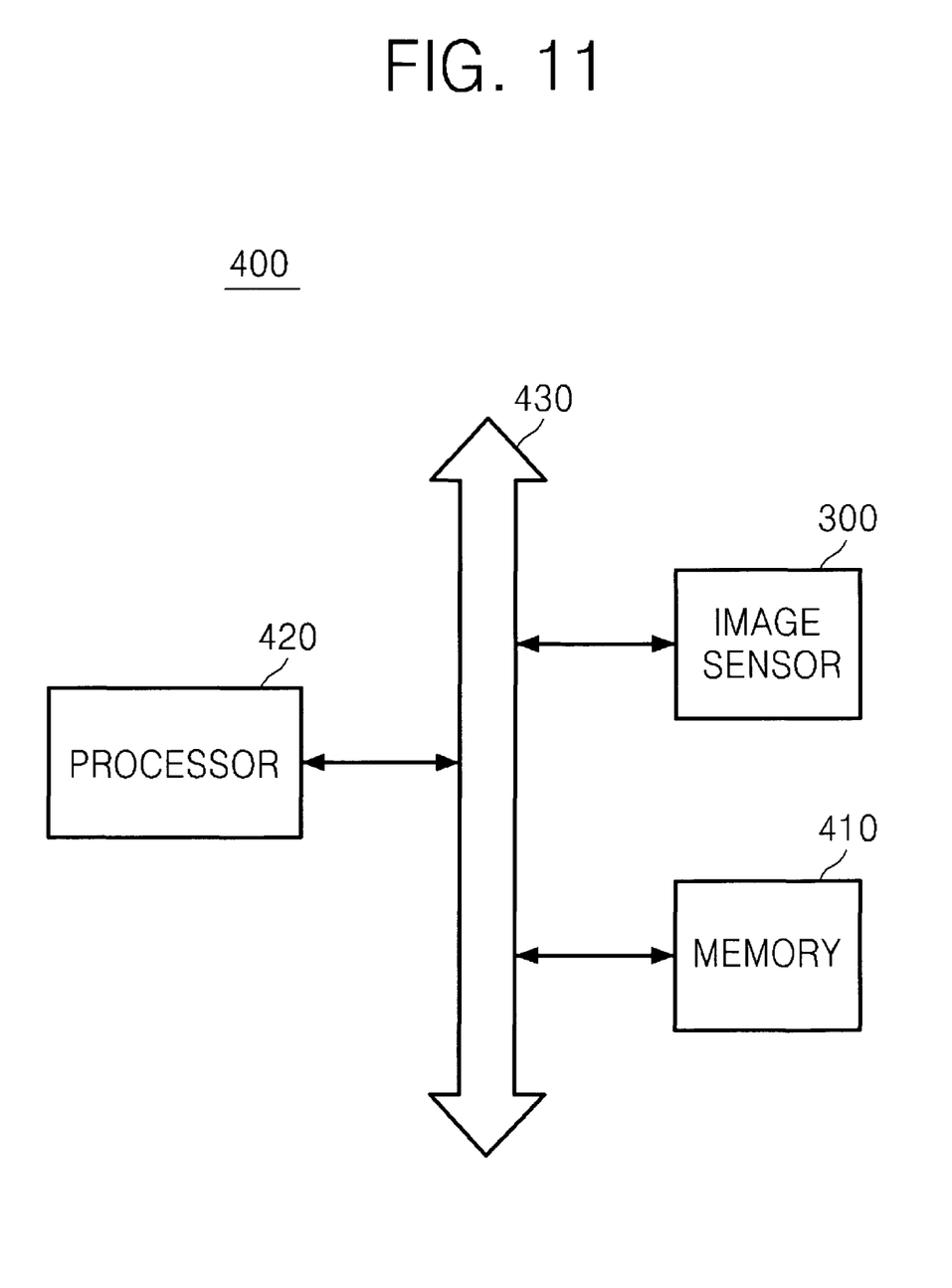
FIG. 11 is a schematic block diagram of an image processing device including the image sensor illustrated in FIG. 10, according to an example embodiment.

FIG. 11 is a block diagram of an image processing device 400 including the image sensor 300 of FIG. 10, according to an example embodiment. Referring to FIG. 11, the image processing device 400 includes the image sensor 300, a memory 410, and a processor 420. The image processing device 400 may be a mobile phone or smart phone with a built-in digital still camera, a scanner, or the like.

The memory 410 may receive an image signal from the image sensor 300 via a bus 430 and store the image signal. The memory 410 may include a plurality of volatile memory cells and/or a plurality of nonvolatile memory cells.

The nonvolatile memory cells may be implemented as an Electrically Erasable Programmable Read-Only Memory (EEPROM), flash memory, Magnetic RAM (MRAM), Spin-Transfer Torque MRAM, Conductive bridging RAM (CBRAM), Ferroelectric RAM (FeRAM), Phase change RAM (PRAM), Resistive RAM (RRAM or ReRAM), Nanotube RRAM, Polymer RAM (PoRAM), Nano Floating Gate Memory (NFGM), holographic memory, a Molecular Electronics Memory Device, and/or an Insulator Resistance Change Memory. The nonvolatile memory cells may store a single bit or a plurality of bits.

The processor 420 may generate at least one control signal for controlling an operation of the image sensor 300. As described above with reference to FIG. 10, the image sensor 300 includes the APS array 320, the row driver 340, the timing control unit 350, and/or the ADC block 330. The image sensor 300 may generate an image signal by converting an optical signal into an electrical signal according to the control signal provided from the processor 420. Accordingly, the memory 410 stores the image signal received from the image sensor 300 under the control of the processor 420. The image sensor 300 may be integrated with the processor 420 and the memory 410. In example embodiments, the image sensor 300 may be integrated with a digital signal processing device, or the image sensor 300 may be configured/manufactured as a separate chip.

Figure 12:
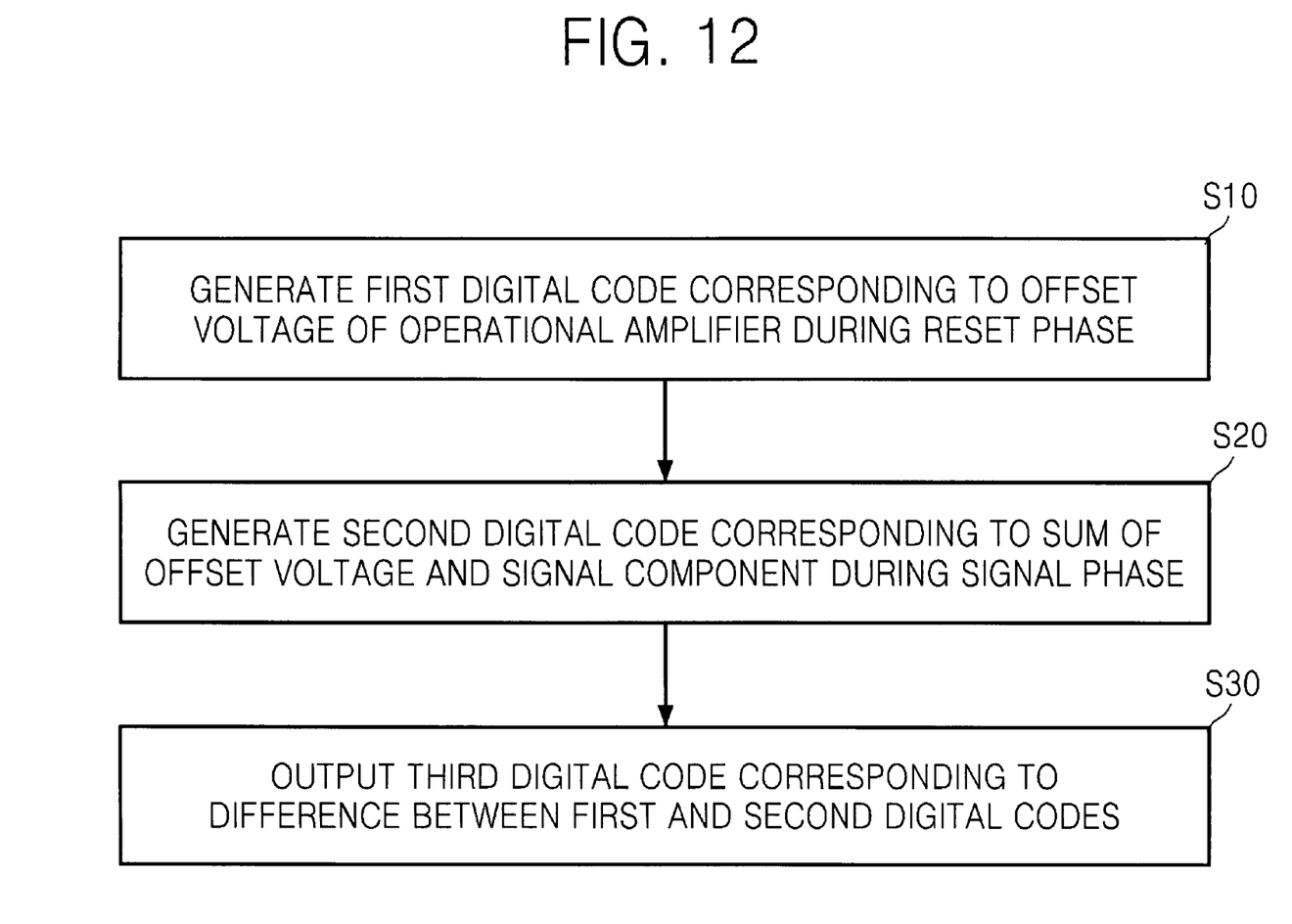
FIG. 12 is a flowchart of analog-digital conversion according to an example embodiment.

FIG. 12 is a flowchart of analog-digital conversion according to an example embodiment. Referring to FIGS. 1 through 9, and 12, in operation S10, the ADC 100 generates the first digital code CODE1 corresponding to the offset component OC of the operational amplifier 111 during the reset phase RESET PHASE. In operation S20, the ADC 100 generates the second digital code CODE2 corresponding to the sum of the offset component OC and the signal component SC during the signal phase SIGNAL PHASE.

As described above with reference to FIGS. 5, 7, and 9, in operation S30, the ADC 100 outputs as the output signal Dout, the digital code corresponding to the difference between the first and second digital codes CODE1 and CODE2. The ADC 100 may perform ADC on an input signal during the reset phase RESET PHASE and during the signal phase SIGNAL PHASE to digitally subtract an offset generated by the CDS circuit 110.

Accordingly, the image sensor 300 including the ADC 100 may remove a fixed pattern in a column direction.

An ADC including an amplifier according to example embodiments may reduce and/or remove an offset component generated in the amplifier during CDS, by using a CDS circuit and/or a ΔΣ ADC.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An analog-digital converter (ADC) comprising:
   a correlated double sampling (CDS) circuit configured to perform CDS on each of a reset signal and an image signal output from a pixel to generate a correlated double sampled reset signal and a correlated double sampled image signal, respectively; and
   a delta sigma (ΔΣ) ADC configured to output a difference between a first digital code generated by performing ΔΣ analog-digital conversion on the correlated double sampled reset signal and a second digital code generated by performing ΔΣ analog-digital conversion on the correlated double sampled image signal,
   wherein the ΔΣ ADC is configured to generate the first digital code such that the first digital code sequentially increases from an initial value during a reset phase, to generate the second digital code such that the second digital code sequentially increases from the initial value during a signal phase, and to output a difference between the first digital code and the second digital code.

2. The image sensor including the ADC of claim 1, wherein the ΔΣ ADC is configured to generate the first digital code such that the first digital code sequentially increases from an initial value during a reset phase, and to generate the second digital code such that the second digital code sequentially increases from the initial value during a signal phase, and to output the difference between the first digital code and the second digital code.

3. The image processing device including the image sensor of claim 2, wherein the ΔΣ ADC is configured to generate the first digital code such that the first digital code sequentially increases from an initial value during a reset phase, and to generate the second digital code such that the second digital code sequentially decreases from the initial value during a signal phase, and to output the difference between the first digital code and the second digital code.

4. An analog-digital converter (ADC) comprising:
   a correlated double sampling (CDS) circuit configured to perform CDS on each of a reset signal and an image signal output from a pixel to generate a correlated double sampled reset signal and a correlated double sampled image signal, respectively; and
   a delta sigma (ΔΣ) ADC configured to output a difference between a first digital code generated by performing ΔΣ analog-digital conversion on the correlated double sampled reset signal and a second digital code generated by performing ΔΣ analog-digital conversion on the correlated double sampled image signal,
   wherein the ΔΣ ADC is configured to generate the first digital code such that the first digital code sequentially decreases from an initial value during a reset phase, and to output, as a difference between the first and second digital codes, a digital code such that the digital code sequentially increases from the first digital code during a signal phase.

5. The image sensor including the ADC of claim 4, wherein the ΔΣ ADC is configured to generate the first digital code such that the first digital code sequentially decreases from an initial value during a reset phase, and to output, as the difference between the first and second digital codes, a digital code such that the digital code sequentially increases from the first digital code during a signal phase.

6. The image processing device including the image sensor of claim 5, wherein the ΔΣ ADC is configured to generate the first digital code such that the first digital code sequentially decreases from an initial value during a reset phase, and to output, as the difference between the first and second digital codes, a digital code such that the digital code sequentially increases from the first digital code during a signal phase.

7. An analog-digital converter (ADC) comprising:
   a correlated double sampling (CDS) circuit configured to perform CDS on each of a reset signal and an image signal output from a pixel to generate a correlated double sampled reset signal and a correlated double sampled image signal, respectively; and
   a delta sigma (ΔΣ) ADC configured to output a difference between a first digital code generated by performing ΔΣ analog-digital conversion on the correlated double sampled reset signal and a second digital code generated by performing ΔΣ analog-digital conversion on the correlated double sampled image signal,
   wherein the ΔΣ ADC is configured to generate the first digital code such that the first digital code sequentially increases from an initial value during a reset phase, to bitwise invert the first digital code in response to a control signal, and to output, as a difference between the first and second digital codes, a digital code such that the digital code sequentially increases from the bitwise-inverted digital code and corresponds to a result of the bitwise inversion during a signal phase.

8. The image sensor including the ADC of claim 7, wherein the ΔΣ ADC is configured to generate the first digital code such that the first digital code sequentially increases from an initial value during a reset phase, to bitwise invert the first digital code in response to a control signal, and to output, as the difference between the first and second digital codes, a digital code such that the digital code sequentially increases from the bitwise-inverted digital code and corresponds to a result of the bitwise inversion during a signal phase.

9. The image processing device including the image sensor of claim 8, wherein the ΔΣ ADC is configured to generate the first digital code such that the first digital code sequentially increases from an initial value during a reset phase, to bitwise invert the first digital code in response to a control signal, and to output, as the difference between the first and second digital codes, a digital code such that the digital code sequentially increases from the bitwise-inverted digital code and corresponds to a result of the bitwise inversion during a signal phase.

10. An analog-digital converter (ADC) comprising:
    a correlated double sampling (CDS) circuit configured to perform CDS on each of a reset signal and an image signal output from a pixel to generate a correlated double sampled reset signal and a correlated double sampled image signal, respectively; and
    a delta sigma (ΔΣ) ADC configured to output a difference between a first digital code generated by performing ΔΣ analog-digital conversion on the correlated double sampled reset signal and a second digital code generated by performing ΔΣ analog-digital conversion on the correlated double sampled image signal,
    wherein the CDS circuit includes an amplifier, the first digital code includes an offset component of the amplifier, and the second digital code includes the offset component of the amplifier and a signal component corresponding to a difference between the correlated double sampled reset signal and the correlated double sampled image signal.

11. The image sensor including the ADC of claim 10, wherein the first digital code includes information regarding an offset component of an amplifier included in the CDS circuit, and the second digital code includes the offset voltage and information about a difference between the correlated double sampled reset signal and the correlated double sampled image signal.

12. The image processing device including the image sensor of claim 11, wherein the first digital code includes information regarding an offset component of an amplifier included in the CDS circuit, and the second digital code includes the offset voltage and information about a difference between the correlated double sampled reset signal and the correlated double sampled image signal.

* * * * *